United States Patent [19]

Weber et al.

[11] Patent Number: 5,039,943

[45] Date of Patent: Aug. 13, 1991

[54] MAGNETOSTRICTIVE MAGNETOMETER

[75] Inventors: Robert J. Weber, Boone; Wing C. Chung, Ames; David C. Jiles, Ames; John D. Verhoeven, Ames, all of Iowa

[73] Assignee: Iowa State University Research Foundation, Inc., Ames, Iowa

[21] Appl. No.: 521,267

[22] Filed: May 8, 1990

[51] Int. Cl.$^5$ ............................................. G01R 33/02
[52] U.S. Cl. ..................................... 324/244; 324/260
[58] Field of Search ......................... 324/244, 260, 96; 350/374, 375; 356/32

[56] References Cited

U.S. PATENT DOCUMENTS

| | | | |
|---|---|---|---|
| 4,308,474 | 12/1981 | Savage et al. | 310/26 |
| 4,609,402 | 9/1986 | McMasters | 75/65 |
| 4,770,704 | 9/1988 | Gibson et al. | 75/65 |
| 4,818,304 | 4/1989 | Verhoeven et al. | 148/103 |
| 4,849,034 | 7/1989 | Verhoeven et al. | 148/100 |

OTHER PUBLICATIONS

"An External Cavity Diode Laser Sensor", Miles et al., Journal of Lightwave Technology, vol. LT-1, No. 1, Mar. 1983, pp. 81-92.
"Barkhausen Effect And Discontinuous Magnetostriction In Terfenol-D", Jiles et al., J. Appl. Phys. 64(10), 15 Nov. 1988, pp. 5417-5418.

Primary Examiner—Walter E. Snow
Attorney, Agent, or Firm—Leydig, Voit & Mayer

[57] ABSTRACT

A magnetometer which employs a rod of magnetostrictive material comprising a ternary alloy of dysprosium, terbium and iron wherein the grains of the material have their common principal axes substantially pointed along the axis of the rod. Means are provided for compressively stressing the rod in order to enhance the magnetostrictive response thereof. A laser source and photosensor are associated with a free end of the rod to function as an external cavity laser sensor. A DC magnetic bias is required for the magnetostrictive rod in order to operate in the sensitive range of the magnetostrictive characteristics of the rod. In a portable implementation of the device, the DC bias is provided by means of permanent magnets, preferably rare earth magnets, in order to provide the high bias fields compatible with high sensitivity of the material in a miniaturized portable device.

18 Claims, 3 Drawing Sheets

MAGNETOSTRICTIVE MAGNETOMETER

FIELD OF THE INVENTION

This invention relates to measurement of magnetic field intensity, and more particularly to an improved magnetometer.

BACKGROUND OF THE INVENTION

Various instruments are available or proposed for measuring magnetic field intensity. A degree of complexity is introduced into many of such devices because of the difficulty of quantitatively measuring magnetic field directly. For example, it is possible to use a magnetostrictive material to respond to the intensity of the magnetic field, and to associate that magnetostrictive material with a further system for measuring magnetostrictively induced dimension changes to produce a quantitative measure of field intensity.

It is not seen that the art has progressed to the stage of providing a magnetometer which concurrently meets the requirements of: (a) simplicity of design and ruggedness of construction requiring little attention to fine recalibration, (b) miniaturization and portability of the entire measuring system, and (c) an adequate degree of sensitivity across an adequately wide range of measurable field intensities.

For example, with respect to simplicity and ruggedness, many magnetometers are still of the laboratory instrument variety, and even when used in the field require substantial care in setup and operation. With respect to miniaturization or portability, the magnetic sensors themselves can be made quite small, but they usually require substantial ancillary components such as electronic power supplies and other complex circuit modules in order to complete a functional system. With respect to sensitivity and range, accurate readings can be made at particular ranges, but known systems are not adequately capable of meeting a wide range of field intensity measurements with the same degree of desirable accuracy.

A potential field of applications not satisfied by currently available magnetometers is the personal magnetic field intensity monitor. Such a device can be considered as similar to a radiation monitor worn by those dealing with radioactive material. However, the magnetometer device would monitor magnetic field exposure and provide an output measure of field intensity to which the wearer has been exposed. Because of the relative complexity of known magnetometer systems, it has not heretofore been possible to configure a small sized (say pocket calculator size) device which could be carried by the user to perform such a function.

SUMMARY OF THE INVENTION

In view of the foregoing, it is a general aim of the present invention to provide a magnetometer which is highly sensitive over a relatively wide range, while being simple and reliable in design.

In that regard, it is an object of the present invention to provide a magnetostrictive magnetometer which is more sensitive than those proposed heretofore, and which provides in addition to such sensitivity a relatively wide operating range of measurable field intensity.

A further object of the invention is to provide a magnetometer system which is easily miniaturized so as to provide a portable unit capable of operating from a conventional miniature battery for substantial periods of time.

According to one feature of the invention, an object is to provide a magnetostrictive magnetometer having the capability of adjusting the sensitivity of the device to accommodate a substantial range of field intensity measurements.

In accordance with the invention, there is provided a magnetometer based on a magnetostrictive rod having a fixed portion mounted with respect to a base and a non-fixed end adapted for magnetostrictive displacement when the rod is subjected to a magnetic field. The rod is formed of a grain-oriented rare earth-iron alloy wherein the grains of the material have their common principle axes substantially pointed along the axis of the rod. Means are provided for applying a steady state magnetic bias to the rod. A reflector is associated with a non-fixed end of the rod. Laser means is fixed with respect to the base and operatively associated with the reflector for gauging the magnetostrictive displacement of the non-fixed end of the rod thereby to indicate the strength of the field to which the rod is subjected. The magnetostrictive rod is mounted in conjunction with means for complying with a compressive stress thereto so as to tailor the magnetostrictive response of the rod.

In a preferred form of the invention, the rare earth-iron alloy is a ternary alloy of dysprosium, terbium and iron. In a particular embodiment of the invention, the means for applying a steady state magnetic bias is a permanent magnet arrangement adapted to provide the high magnetic bias fields useful in conjunction with the rare earth-iron magnetostrictive rod.

It is a feature of the invention that a magnetostrictive magnetometer is provided with high sensitivity by utilization of a particular magnetostrictive material in conjunction with means for compressively stressing that material to enhance the magnetostrictive response thereof. The particular magnetostrictive material referred to in the foregoing is a rare earth-iron alloy, preferably a grain-oriented ternary alloy of dysprosium, terbium and iron, wherein the grains of the material have their common principal axes substantially pointed along the axis of the magnetostrictive rod. Such material has the characteristic of enhancing magnetostrictive properties when subjected to compressive stress. When subjected to an appropriate compressive stress and provided with a related steady state magnetic bias, a magnetometer according to the invention has the capability of being 50 or more times more sensitive than a proposed system utilizing a nickel magnetostrictive element.

It is a further feature of one embodiment of the invention that the magnetostrictive material is provided with a magnetic DC bias without the need for external DC power sources to supply power for such bias. According to a detailed feature of the invention, such magnetic bias is provided by rare earth magnets capable of applying high biasing fields without the need for substantial magnetic mass, thus allowing miniaturization of the device.

A feature of the device in one embodiment is the use of a relatively inexpensive and low power laser diode and source in conjunction with a magnetostrictive element, the magnetostrictive element being adapted to provide a highly sensitive response to changes in magnetic field, allowing the use of more readily available and inexpensive laser components. In the portable implementation of the device, it is a further feature that electrical power need be provided for only the laser elements, along with any ancillary electronic components used to process the output signal of the magnetometer, and not for any electromagnetic biasing elements.

Other objects and advantages will become apparent from the following detailed description when taken in conjunction with the drawings, in which:

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
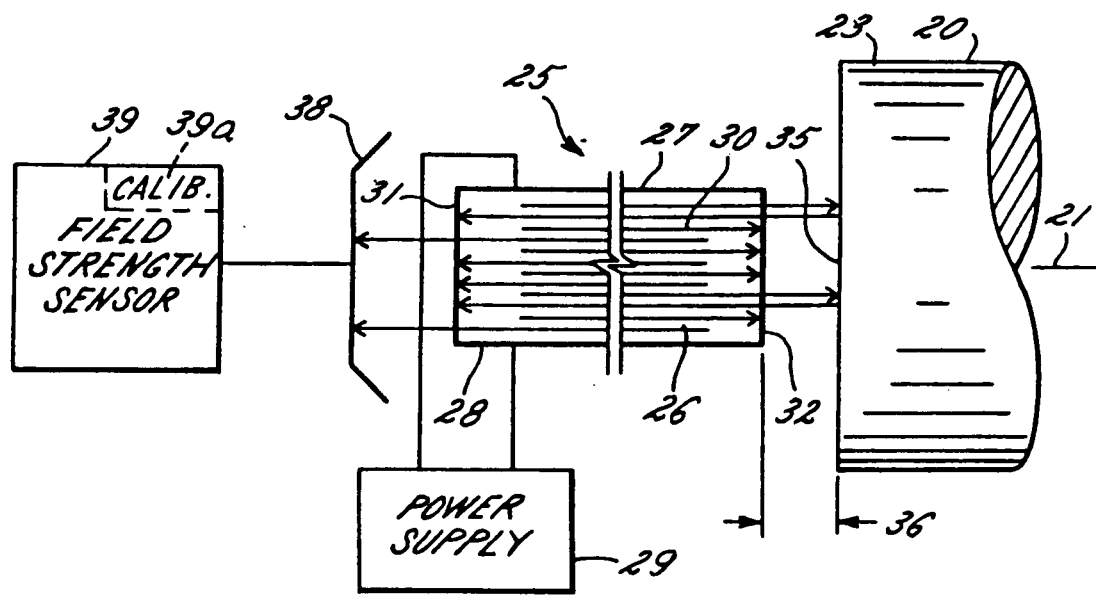
FIG. 1 is a diagram schematically illustrating the relationship between the optical, electronic and magnetostrictive elements of a magnetometer constructed in accordance with the present invention.

Turning now to the drawings, FIG. 1 shows the operative elements of a magnetostrictive magnetometer employing a compressively stressed rare earth-iron alloy rod in conjunction with an external cavity diode laser sensor, constructed in accordance with the present invention. The magnetostrictive element is in the form of rod 20 formed of a grain-oriented rare earth-iron alloy, preferably a ternary alloy of dysprosium, terbium and iron, wherein the grains of the material have their common principal axes substantially pointed along the axis 21 of the rod 20.

The alloy which forms the rod 20 is significant for two primary features. First of all, it has a high magnetostrictive response, typically on the order of 1000 PPM even in the unstressed condition. Secondly, it is a material which exhibits the property of increasing its magnetostrictive response when subjected to compressive stress. The latter feature allows the rod t be controllably stressed during calibration to produce a desired magnetostrictive characteristic.

The currently preferred material for the rod has the trade name Terfenol-D, and is a ternary alloy comprising dysprosium, terbium and iron, preferably in the following relationship: $Tb_{0.3} Dy_{0.7} Fe_2$. While that composition is preferred, others may be used when they provide the desired high degree of magnetostrictive response, an adequate anisotropy in order to maximize domain-wall mobility, and the desired characteristic of enhancing magnetostrictive response by application of a compressive stress. Suitable materials are described in U.S. Pat. No. 4,308,474 and variations in manufacturing techniques in the following U.S. Pat. Nos.: 4,609,402, 4,818,304, 4,770,704 and 4,849,034.

As will be described in greater detail below, the Terfenol rod has a fixed portion which is fixed with respect to a base plate and a free end 23 adapted for magnetostrictive displacement in response to imposed magnetic fields. Means are provided for gauging the amount of magnetostrictive movement of the non-fixed end 23 of the rod 20, such means being shown in the illustrated embodiment as external cavity diode laser sensor 25. It is seen that the sensor 25 includes a semiconductor laser 26 having electrodes 27, 28 powered by a power supply 29 so as to produce coherent radiation within a laser cavity 30. As is well known in the art, the facets 31, 32 of the laser are partially reflective to cause reflection of coherent light within the cavity 30. Coherent light also penetrates the facets 31, 32 in a beam substantially normal to the facet. Adjacent the facet 32 is the free end 23 of the Terfenol rod 20 which is associated with a reflector 35. Preferably, the end of the rod is simply polished to provide a reflective surface. As an alternative, a separate reflector can be affixed to the end of the rod. The gap 36 between the facet 32 and the reflective face 35 is maintained at a very small dimension, preferably on the order of a few wavelengths of the laser light or less (e.g., 10 microns or less), such that the reflective surface 35 affects activity within the cavity 30. When the reflective coefficient from the surface 35 and the phase shift from the gap 36 cause the reflected wave into the cavity 30 to be in phase with the coherent light in the cavity, the reflected light reinforces the laser light increasing the optical output of the laser 26. Thus, the dimension of the gap 36 directly affects the laser output power, and to the extent the Terfenol rod 20 expands or contracts to alter that gap, that expansion or contraction is related to the output power of the laser.

Associated with the opposite facet 31 of the laser is a photodetector 38, adapted to receive and measure the optical output of the laser through the facet 31. Thus, the amount of light incident on photodetector 38 is a direct measure of laser power output, and as described above will thus be a measure of the gap 36. The photodetector 38 is coupled to electronic circuitry 39 which responds to the signal from the photodetector 38, such as to the peak-to-peak amplitude thereof, to produce a measure of field strength to which the rod 20 had been subjected. Thus, the circuitry 39 in its typical configuration includes an amplifier for buffering the signal from the photodetector 38, an analog-to-digital converter, and digital processing means for scaling the digitized photodetector signal in accordance with the magnetostrictive response of the device to produce a direct indication of field strength. It is also preferable to include within circuitry 39 an adjustable circuit gain mechanism 39a in the form of an analog or digital tuning adjustment, to provide a means for calibrating the device against a predetermined standard.

Figure 2:
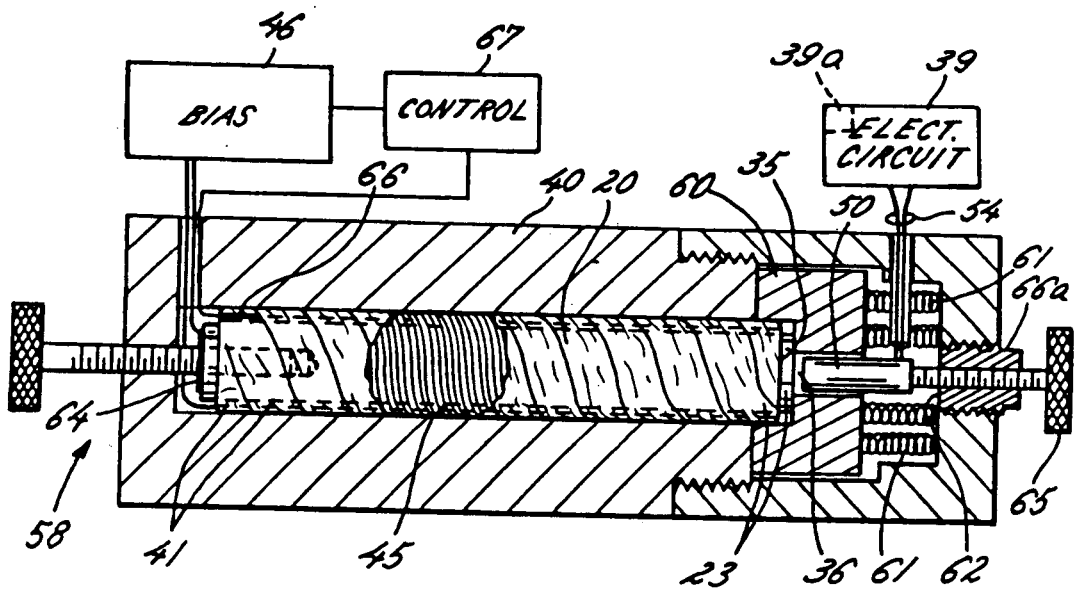
FIG. 2 is an elevational view illustrating a magnetometer according to a first embodiment of the present invention.

Turning now to FIG. 2, there is shown the basic elements of FIG. 1 assembled in a magnetometer device exemplifying the present invention. It is seen that the device is formed in a housing 40 which serves as a base or reference for the remaining elements. The Terfenol rod 20 is mounted within the housing and is seen to have a portion thereof in the example end 41, fixed with respect to the base 40. The Terfenol rod 20 which may be on the order of 4 inches in length and approximately ¼ inch in diameter has the opposite end 23 disposed as a free end capable of displacement with respect to the base 40 in response to magnetostrictive forces in the rod 20 generated upon subjecting the rod to a variable magnetic field. Means are provided for supplying a steady state magnetic bias to the rod, in the FIG. 2 embodiment such means being shown as an electrical coil 45 wrapping the portion of the rod 20 enclosed within the housing 40. A bias supply 46 supplies electrical current to the coil 45 to produce a steady state magnetic field. When using Terfenol-D, the magnetic field is preferably on the order of 200 Oe (Oersteds).

As noted in connection with FIG. 1, the free end 23 the Terfenol rod is preferably polished to provide a mirror surface 35 which faces a laser diode assembly 50. The mirrored surface thus serves as the external reflective element of the open cavity laser sensor. A relatively small gap 36 formed between the laser diode assembly 50 and the reflective face 35 causes those elements to function in the open cavity laser mode as described above. Output signals from the laser diode assembly 50 are coupled by means of electrical conductors 54 to electronic circuitry 39 adapted to produce a quantitative output indication of field strength.

Before turning to the details of the laser diode assembly, the means for adjusting and tuning the magnetometer will first be described. It is seen that the fixed end 41 of the Terfenol rod 20, while being fixed at the predetermined point in the housing 40, has associated therewith an adjustment mechanism 58 adapted to compressively stress the rod. It will be clear, however, that the end 41 is fixed with respect to a common reference (common with respect to the laser assembly 50), and that the majority of the length of the rod 20 is free so that the rod can respond magnetostrictively to displace the free end 23 either toward or away from the laser assembly 50.

The free end 23 of the rod 20 is supported in a yoke 60 which is biased by means of springs 61 against a fixed end 62 of the housing 40. The amount of spring biased force applied by the yoke 60 to the free end 23 of the rod 20 is controlled by adjustment mechanism 58 which is threaded in the housing to position a collar 64 axially within the housing. The collar 64 is attached to the Terfenol rod 20 so as to control the axial position of the rod 20 and thus the amount of force exerted on the rod by spring biased yoke 60. Thus, if the mechanism 58 is rotated to drive the collar 64 inwardly to bias the rod 20 toward the yoke 60, the springs 61 will be further compressed, increasing the compressive stress on the rod 20. When the mechanism 58 is rotated in the opposite direction to reduce the spring biased force applied by yoke 60 against the non-fixed end of the rod, the compressive stress is partly relieved. Thus, the operator has the opportunity by turning of adjustment mechanism 58 to establish a predetermined compressive stress along the axis of the rod thereby to adjust the magnetostrictive response thereof.

The embodiment of FIG. 2 also illustrates a mechanism for adjusting the size of the gap 36 established between the reflective end 35 of the magnetostrictive rod and the laser source within the laser assembly 50. To that end, an adjusting mechanism 65 is provided which by means of threaded engagement with a collar 66a tends to move the laser assembly 50 either closer to or further from the end 23 of the Terfenol rod to make an initial adjustment of the minute gap between those elements. As a final adjustment mechanism for the embodiment of FIG. 2, there is provided a bias source 46 which can also be adjusted in appropriate circumstances to provide a steady state magnetic bias to the Terfenol rod which, in combination with the stress applied by adjustment mechanism 58, serves to establish the operating point for the system in a desired portion of the response characteristic of the rod. In the simplest embodiment, potentiometer type adjustment means are associated with bias source 46 to establish a field, such as the aforementioned 200 Oe, which is applied by the coil 45 to the rod to establish its optimum operating point.

In one specialized implementation of the device, means are provided for automatically adjusting the bias during operation. To that end, FIG. 2 shows a sensor 66 adapted to sense the strength of the steady state bias produced by coil 45, and a control mechanism 67 responsive to signals produced by the sensor to function in a servo loop to control the bias source 46. Thus, the sensor 66, the control element 67 and their relationship to bias source 48 function as a servo loop to provide a steady state bias to the magnetostrictive rod in this particular and specialized application of the invention. However, in its most typical embodiment, the bias source 46 will be either preset, or as will be described below, will be established by nonadjustable permanent magnets, to provide a very simple and reliable implementation of the invention.

Figure 5:
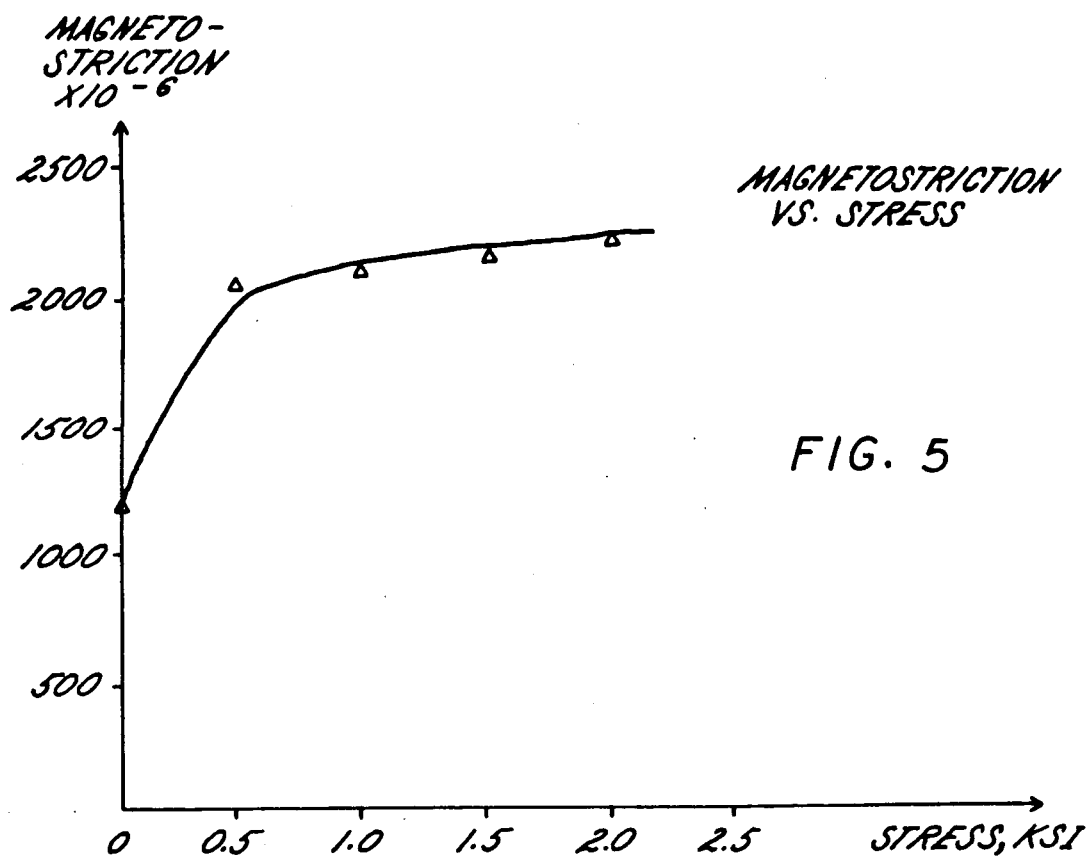
FIGS. 5 and 6 are diagrams showing the relationships useful in understanding the manner in which the magnetostrictive output of a given device is responsive to applied compressive stress.
Figure 6:
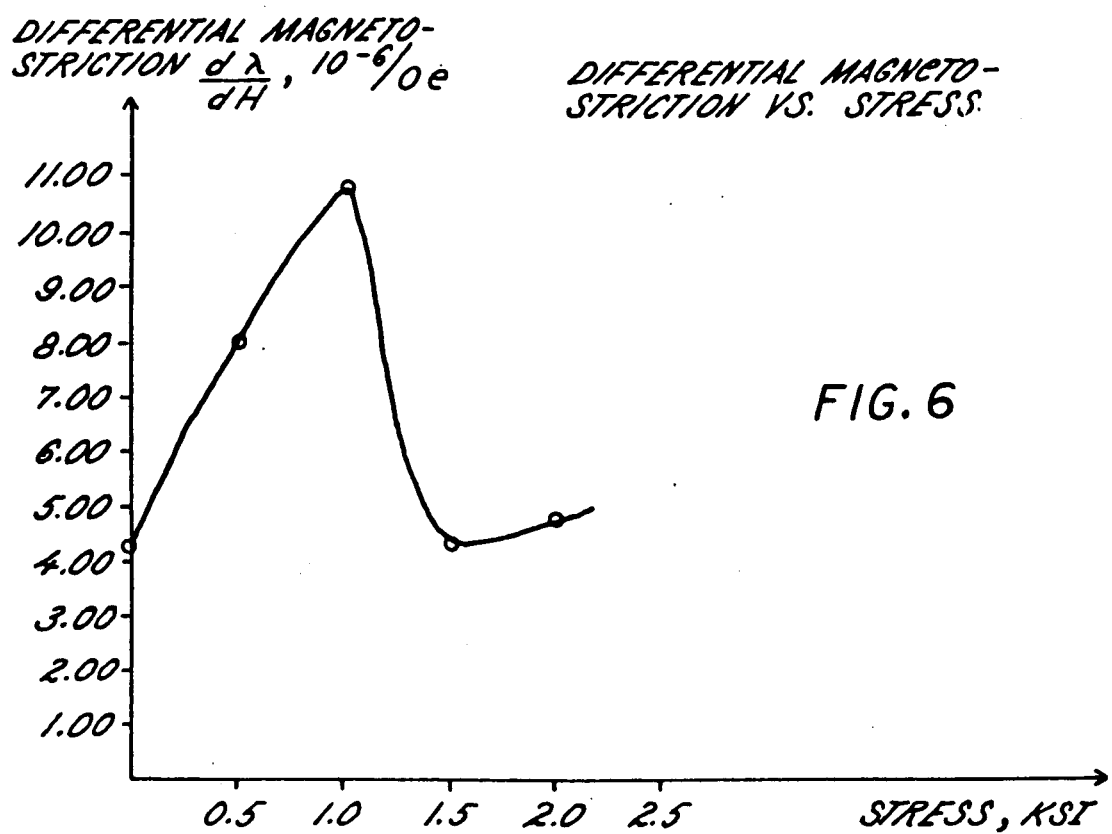

Referring briefly to FIGS. 5 and 6, the point of calibration and adjustment will be further explained. FIG. 5 shows a plot of magnetostriction as a function of applied stress, whereas FIG. 6 shows differential magnetostriction ($d\lambda/dH$), also as a function of applied stress. In setting up the device, it is typical to derive such relationships for the material being used and to determine from such relationships where on the stress characteristic it is preferred to operate. It is preferred, referring to FIG. 5, to operate in as highly sensitive a portion of the curve as can be readily achieved, so as to provide maximum sensitivity. However, referring also to FIG. 6, it will be seen that it is desired to operate on a reasonably linear portion of the FIG. 6 curve so that minor changes in stress which might be occasioned by temperature changes, by magnetostrictive changes in the device, and the like, do not have a substantial effect on the differential magnetostriction characteristic. Thus, for the materials plotted in FIGS. 5 and 6, it would appear to be preferred to operate at about the 0.4 to 0.5 ksi stress portion of the rod. For the device of FIG. 2, the adjustment mechanism 58 would then be operated, either in a calibrated mode, or by using a force indicating device, to adjust the mechanism 58 until approximately 0.4 to 0.5 ksi stress is applied to the rod.

When the bias supply 46 is adjustable, it would then be preferred to adjust the bias supply to accommodate the range of magnetic fields to be measured, considering that a typical bias on the order of 200 Oe is preferred for normal operating conditions. If higher magnetic fields are to be measured, the bias might be reduced somewhat. A plot of magnetostriction vs. applied field is easily determined for a device, a linear portion of that plot selected, and a steady state bias is selected from that plot to determine the adjustment (when adjustable) of the bias source 46 to provide the desired steady state field.

The final adjustment mechanism 65 is typically adjusted with no external field applied to the device to achieve a desired steady state output as a zero setting, during the bias and setup adjustment.

Having thus described the basic mechanism and means for adjusting it, attention will now be turned to the details of the laser assembly 50 which gauges magnetostrictive displacement of the free end 23 of the magnetostrictive rod. For purposes of gauging the degree of movement of the non-fixed end 23 of the magnetostrictive rod 20, the laser assembly 50 is fixed with respect to the base 40 and is associated with the reflective end 35 of the magnetostrictive rod. It is believed to have been the practice in open cavity laser sensors to utilize high quality, low noise lasers and photodetectors in sensing the minute degree of magnetostrictive movement possible in the past. However, in accordance with the invention, due to the highly responsive magnetostrictive elements described above, it is possible in many applications to utilize a laser assembly 50 which is an adaptation of a commercially available laser disk reading device, and thus dispense with the extra expense of a specialized diode assembly. However, in the most demanding applications, it is also possible to maximize the characteristics of the diode laser assembly 50.

Figure 4:
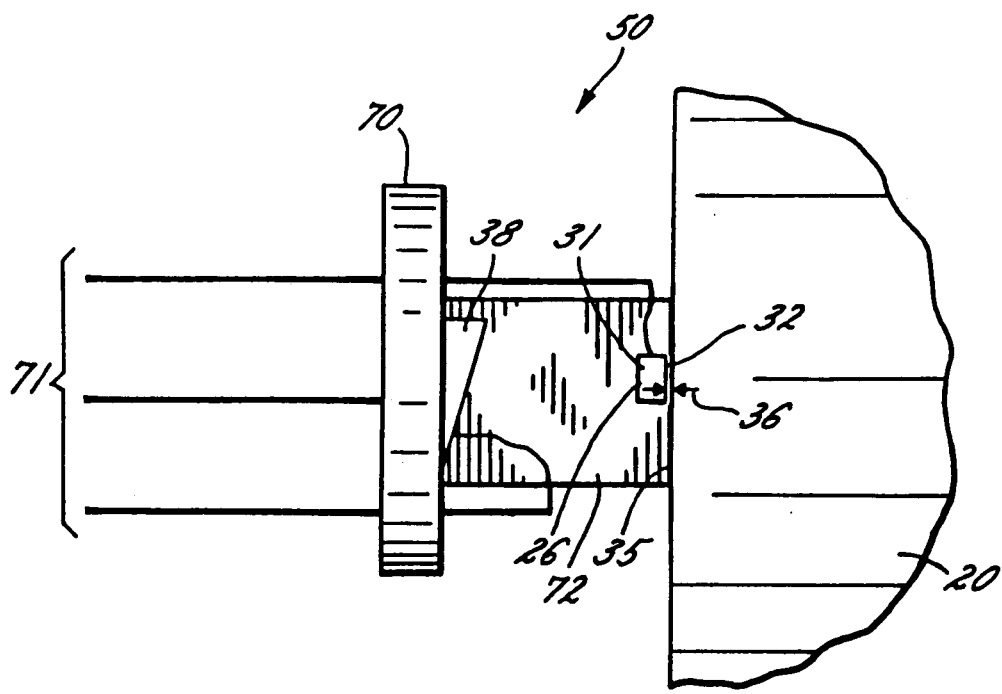
FIG. 4 is a partial view illustrating the preferred laser elements for use in the magnetometers of FIGS. 2 and 3.

In the currently preferred practice of the invention, however, a commercially available optical disk reading assembly, such as an ML-4402 made by Mitsubishi is utilized as both the laser source and photodetector. Such a device is illustrated in FIG. 4 in its relationship to the reflective face 35 of the Terfenol rod 20. The laser diode assembly as commercially supplied includes a lens, which is removed for utilization in this invention so as to allow the diode assembly 50 to be positioned with the laser source 26 closely adjacent the face 35 to provide a very minute gap 36 on the order of a few wavelengths of laser light, on the order of 10 microns or less. The mirrored surface 35 thus reflects light back into the cavity of the laser 26 and the dimension of the gap 36 thus determines the degree of coherence of the light reflected back into the cavity, and thus the power output of the laser. The photodetector 38 is also an element of the combined optical device and is adapted to sense light emitted by the laser through the rear facet 31.

It is seen that in the commercial device both the laser 26 and detector 38 are mounted on a single header 70 having electrical leads 71 which are connected to the laser, to the photodetector, and as a common to a heat sink 72 which carries those elements. It is thus seen that mounting of the header 70 and connecting signals to the electrical lead 71 will serve to both illuminate the external cavity laser and sense signals generated by that laser which are a measure of its optical power and thus of the dimension of the gap 36 between the laser facet 32 and the reflective face 35 of the Terfenol rod.

The FIG. 2 embodiment of the invention is useful in providing a magnetometer in which the DC bias for the magnetostrictive rod can be adjusted. Thus, it is useful when the device is of the multi-purpose variety intended for sensing fields of substantially different strength. It is a relatively straightforward matter to adjust the steady state magnetic bias applied to the rod in order to select an operating point for the device which is compatible with the strength of the field to be measured.

In an alternate and sometimes preferred embodiment, however, the device is simplified and miniaturized by not only removing the adjustability of the magnetic bias arrangement, but also utilizing permanent magnets for the steady state bias in order to eliminate the need for any electrical power source for the electromagnetic devices. The result is a miniaturized device which might be carried by the user as a personal magnetic field sensor as described above.

Figure 3:
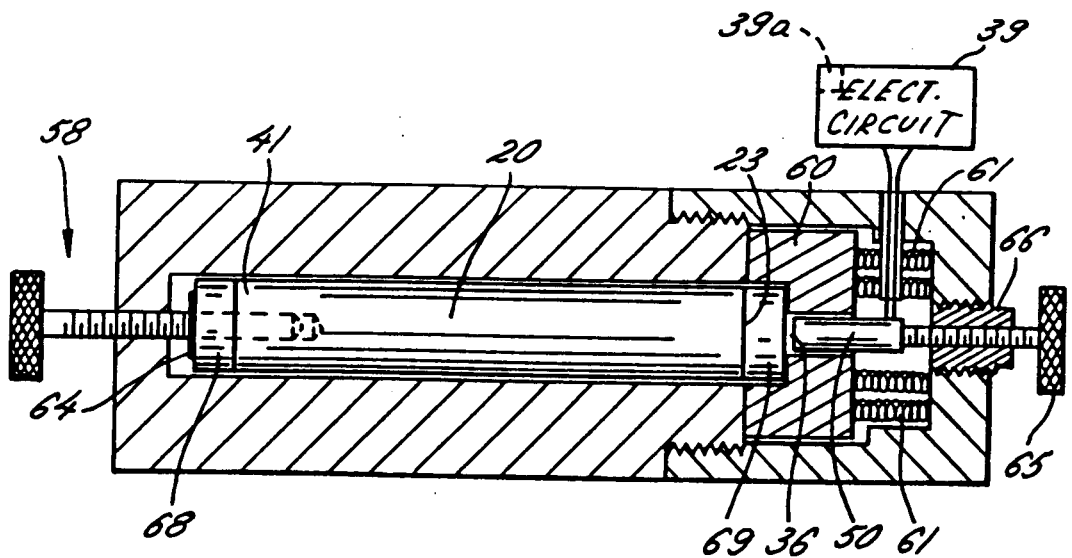
FIG. 3 is an elevational view similar to FIG. 1 illustrating a further embodiment of the present invention.

The embodiment of FIG. 3 is illustrated as an adaptation of the embodiment of FIG. 2 in order to highlight the major differences. Thus, the FIG. 3 embodiment has no electromagnetic coil 45 or bias source 46. Instead, a pair of permanent magnets 68, are provided, disposed at either end of the rod 20 for providing a steady state DC bias for the system. As in the prior embodiment, a steady state bias of 200 Oe is preferred for many applications, and to achieve that substantially high bias with relatively small magnets rare earth permanent magnets, such as samarium cobalt, are preferred. As an alternative, a magnetic material comprising neodymium, iron and boron is utilized in cylindrical inserts 68, 69 to provide the relatively high fields desired with minimum magnetic mass.

It is seen that the compressive stress adjustment mechanism 58 is similar to that shown in FIG. 2, but is threaded through one of the magnets 68 in order to adjust the tension of the springs 61 which in turn adjusts the force applied by the yoke 60 against the free end of the rod 20. It is preferred that the magnetic insert 68 be threaded to provide the adjustment mechanism or, in the alternative, particularly where it is desired to have the same area of magnet 68 as is provided by magnet 69, to utilize a collar surrounding and affixed to the exterior of the magnet 68. It should also be noted that the face of magnet 69 should be polished to serve as reflector 35, or alternatively a reflective insert secured to the face of the magnet.

While the embodiment of FIG. 3 is shown as being similar to that of FIG. 2, when the system is utilized as a personal electromagnetic sensor, the configuration may change where appropriate. Thus, it is preferable in a personal magnetic field sensor to reduce the size of the magnetostrictive rods, and to apply a mechanism for fixedly applying a compressive stress to the rod so as to reduce the overall size of the device. The adjustment mechanism for establishing the gap 36 between the rod and laser assembly would also be configured for adjustment during manufacture but nonadjustability thereafter, all with a desire to provide a simple and compact device which can be carried on the person of the user without inconvenience.

The nature of the permanent magnets 68, 69 is significant for such a personal device in that it relieves the need for any electrical power source for providing DC magnetic bias to the magnetostrictive rod. Considering the relatively high bias fields required, in the normal course a substantial electrical source would be needed to provide the steady state bias. However, using rare earth magnets such as those described above, the high fields are provided, which are commensurate with the magnetostrictive material, and its enhanced performance due to compressive stressing, without the need for either very large magnets or external power sources. As a result, it will be possible to provide a personal magnetic field sensor which can be configured in a relatively small calculator size case to be carried on the person of the user without great inconvenience.

In view of the foregoing, it will be now be appreciated that what has been provided is an improved magnetometer which has various capabilities and can be configured in various ways, but all relying on a particularly kind of magnetostrictive material operated in a particular manner to achieve enhanced response. The magnetostrictive material is a rare earth-iron alloy, preferably a ternary alloy of dysprosium, terbium and iron, which in its unstressed condition provides a high magnetostrictive response. That response is enhanced by applying a compressive stress to the rod to achieve a desired operating point in the magnetostrictive characteristic. That operating point requires high bias fields which are achieved in one application by an electrical biasing arrangement, and in a portable device by high field permanent magnets which provide the necessary steady state magnetic bias without substantially increasing the mass of the overall system.

What is claimed is:

1. A magnetometer comprising, in combination:
    a magnetostrictive rod having a fixed portion mounted with respect to a base and a non-fixed end adapted for magnetostrictive displacement when the rod is subjected to a magnetic field,
    the rod being formed of a grain-oriented rare earth-iron alloy wherein the grains of the material have their common principal axes substantially pointed along the axis of the rod,
    means for applying a steady state magnetic bias to the magnetostrictive rod,
    a reflector associated with the non-fixed end of the rod,
    laser means fixed with respect to the base and operatively associated with the reflector for gauging the magnetostrictive displacement of the non-fixed end of the rod thereby to indicate the strength of the field to which the rod is subjected, and
    means for applying a compressive stress to the rod to tailor the magnetostrictive response thereof.

2. The combination as set forth in claim 1 further including means for adjusting the compressive stress applied to the rod to alter the magnetostrictive response thereof.

3. The combination as set forth in claim 1 wherein the rare earth-iron alloy is a ternary alloy of dysprosium, terbium and iron.

4. The combination as set forth in claim 1 wherein the laser means comprises a laser source aimed at the reflector and displaced therefrom by a narrow gap so that the reflector functions as an external cavity reflector with said laser, a photodetector adapted to receive light produced by said laser and produce a signal related to the intensity thereof, and means associated with the photodetector for producing a signal related to the output power of the laser and thereby to the gap between the laser and the reflector.

5. The combination as set forth in claim 4 wherein the laser source and photodetector are formed in a common housing and juxtaposed for transmitting and receiving laser illumination on short direct optical paths.

6. The combination as set forth in claim 1 wherein the means for applying a magnetic bias to the magnetostrictive rod comprises a pair of permanent magnets disposed at opposite ends of the rod for providing a steady state magnetic bias thereto.

7. The combination as set forth in claim 6 wherein the permanent magnets are formed of a rare earth material with a high flux to weight ratio.

8. The combination as set forth in claim 7 wherein the permanent magnet material includes samarium cobalt.

9. The combination as set forth in claim 7 wherein the permanent magnet material includes a neodymium iron boron magnetic composite.

10. The combination as set forth in claim 4 including means for adjusting the magnetic bias applied to the magnetostrictive rod, said means including a magnetic coil surrounding the rod, a detector for measuring the strength of the magnetic bias field, and servo means responsive to the detector for controlling the field produced by the magnetic coil.

11. The combination as set forth in claim 4 wherein the means associated with the photodetector includes adjustment means for calibrating said signal to conform with a predetermined standard.

12. A portable magnetometer with internal power source comprising, in combination:
    a magnetostrictive rod having a fixed portion mounted with respect to a base and a non-fixed end adapted for magnetostrictive displacement when the rod is subjected to a magnetic field,
    the rod being formed of a grain-oriented rare earth-iron alloy wherein the grains of the material have their common principal axes substantially pointed along the axis of the rod,
    permanent magnet biasing means for applying a substantial steady state bias to the magnetostrictive rod to bias the rod in a desired range of magnetostrictive sensitivity, the permanent magnet means including rare earth magnets for producing said substantial bias field without requiring substantial magnetic mass or driving electronics,
    low power laser means fixed with respect to the base and operatively associated with the non-fixed end of the magnetostrictive rod for gauging the magnetostrictive movement of the non-fixed end as a measure of the field to which the rod is subjected, and
    a long life battery for powering the low power laser means.

13. The combination as set forth in claim 12 wherein the rare earth-iron alloy is a ternary alloy of dysprosium, terbium and iron.

14. The combination as set forth in claim 13 further including means for applying a compressive stress to the magnetostrictive rod to enhance the magnetostrictive response thereof.

15. The combination as set forth in claim 14 further including means for adjusting the compressive stress applied to the magnetostrictive rod as a means of adjusting the magnetostrictive response thereof.

16. A method of quantitatively measuring the strength of a magnetic field, the method comprising the steps of:
    mounting a magnetostrictive rod comprising a rare earth-iron alloy with a portion thereof fixed with respect to a reference and a non-free end adapted for magnetostrictive displacement when the rod is subjected to a magnetic field,
    applying a compressive stress to the rod to tailor the magnetostrictive response thereof,
    applying a substantial steady state magnetic bias to the magnetostrictive rod compatible with the magnetostrictive response of the rare earth-iron alloy and the compressive stress applied to the rod,
    positioning a laser source and photodetector with respect to the free end of the magnetostrictive rod to cause the free end to operate as an open cavity reflector for said laser,
    measuring the power output of the laser as the free end of the rod is displaced by the magnetostrictive response thereof, and interpreting the power output of the laser as a measure of the magnetic field to which the magnetostrictive rod is subjected.

17. The combination as set forth in claim 16 further including the step of adjusting the compressive stress on the magnetostrictive rod in order to tailor the magnetostrictive response thereof.

18. The combination as set forth in claim 16 further including the step of relatively adjusting the laser with respect to the free end of the magnetostrictive rod in order to calibrate the output thereof.

* * * * *